United States Patent [19]
Yamazaki

[11] Patent Number: 5,840,118
[45] Date of Patent: Nov. 24, 1998

[54] LASER PROCESS SYSTEM AND METHOD OF USING THE SAME

[75] Inventor: Shunpei Yamazaki, Tokyo, Japan

[73] Assignee: Semiconductor Energy Laboratory Co., Ltd., Kanagawa-ken, Japan

[21] Appl. No.: 574,184

[22] Filed: Dec. 18, 1995

[30] Foreign Application Priority Data

Dec. 19, 1994 [JP] Japan .................................. 6-335042

[51] Int. Cl.$^6$ .............................................. C30B 31/20
[52] U.S. Cl. .......................... 117/103; 112/92; 112/904; 112/914; 438/306
[58] Field of Search ................. 117/90, 92, 94, 117/103, 904, 914; 438/306

[56] References Cited

U.S. PATENT DOCUMENTS

| | | | |
|---|---|---|---|
| 3,585,088 | 6/1971 | Scwittke et al. ............................ | 117/9 |
| 4,059,461 | 11/1977 | Fan et al. ..................................... | 117/9 |
| 4,343,829 | 8/1982 | Tochikubo et al. .......................... | 117/9 |
| 4,345,967 | 8/1982 | Cook ........................................ | 117/904 |
| 4,498,951 | 2/1985 | Tamura et al. ........................... | 117/904 |
| 5,147,826 | 9/1992 | Liu et al. ................................. | 437/233 |
| 5,275,851 | 1/1994 | Fonash et al. ........................... | 427/578 |
| 5,304,357 | 4/1994 | Sato et al. ............................... | 118/50.1 |
| 5,529,937 | 6/1996 | Zhang et al. ............................. | 438/471 |
| 5,561,081 | 10/1996 | Takenouchi ............................... | 438/166 |
| 5,591,668 | 1/1997 | Maegawa et al. ....................... | 117/904 |

OTHER PUBLICATIONS

G. Liu et al., "Polycrystalline silicon thin film transistors on Corning 7059 glass substrates using short time, low-temperature processing," *Appl. Phys. Lett.* 62(20), May 17, 1993, pp. 2554–2556.

G. Liu et al., "Selective area crystallization of amorphous silicon films by low-temperature rapid thermal annealing," *Appl. Phys. Lett.* 55(7), Aug. 14, 1989, pp. 660–662.

*Primary Examiner*—Felisa Garrett
*Attorney, Agent, or Firm*—Sixbey, Friedman, Leedom & Ferguson, P.C.; Gerald J. Ferguson, Jr.; Jeffrey L. Costellia

[57] ABSTRACT

Disclosed herein is an effective method of annealing a semiconductor film by irradiation with a laser light. This method consists of irradiating an amorphous silicon film 102 formed on a glass substrate 110 with a linear laser light 100 which is relatively scanned in the direction of arrow 109. The area which will soon be or has just been irradiated with a laser light is heated by heaters 105 and 106. Irradiation in this way crystallizes the amorphous silicon film 102 without abrupt phase change which otherwise occurs due to laser light irradiation.

21 Claims, 5 Drawing Sheets

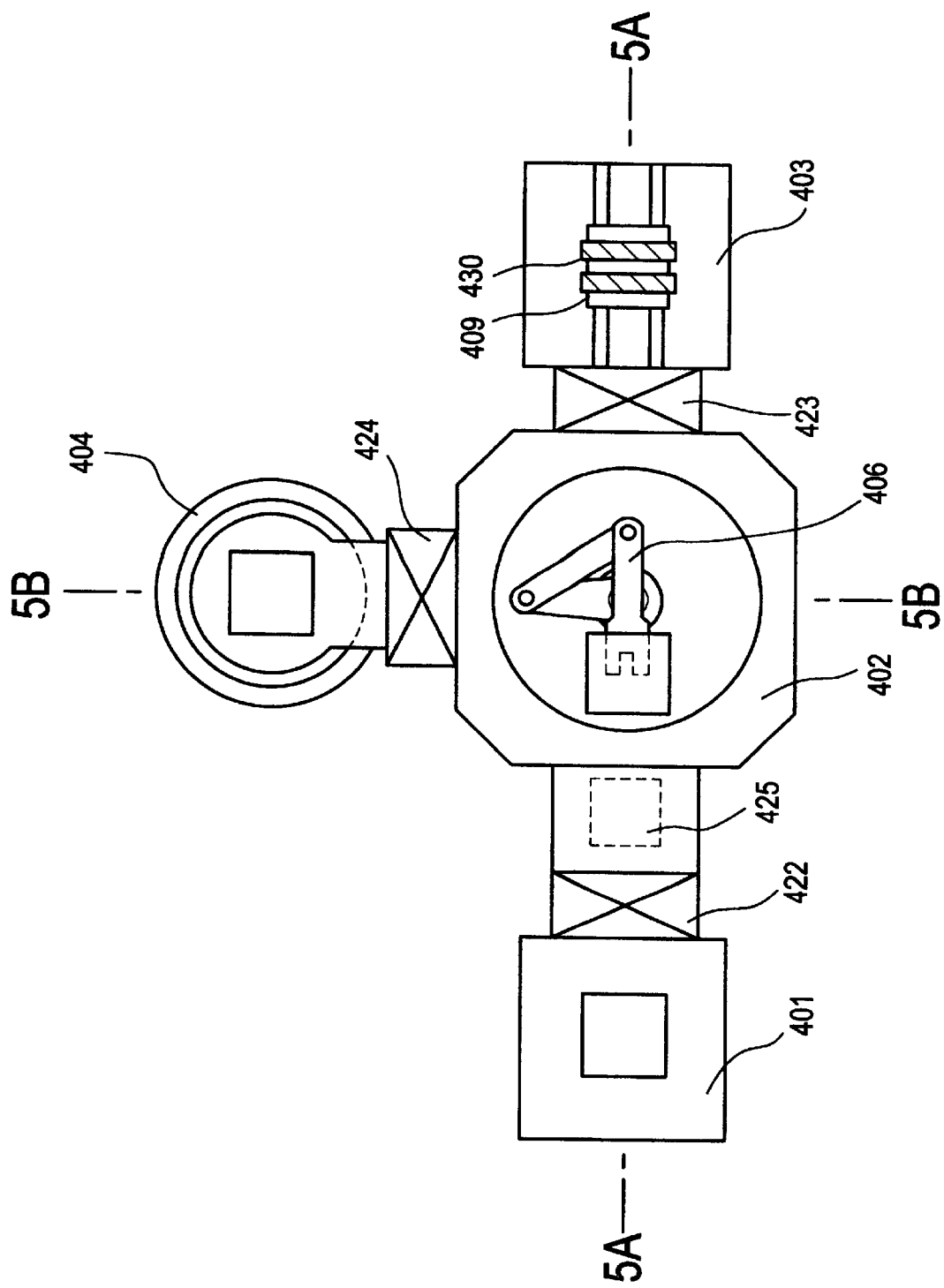

LASER PROCESS SYSTEM AND METHOD OF USING THE SAME

BACKGROUND OF THE INVENTION

1. Field of the Invention

The present invention relates to an apparatus and a method for laser light irradiation of a semiconductor thin film formed on a substrate having an insulating surface. The present invention may be used to produce a crystalline silicon film from an amorphous silicon film by laser light irradiation.

2. Description of the Prior Art

There is a known technology for forming a crystalline silicon thin film on a glass substrate. It consists of forming an amorphous silicon film on a glass substrate by plasma CVD or the like and crystallizing the amorphous silicon film by heat treatment or laser light irradiation.

The technology of forming a crystalline silicon thin film on a glass substrate is necessary to produce the liquid crystal display devices of active matrix type which are formed on a transparent substrate for light transmission. Transparent substrates include those which are made of plastics, quartz, or glass. Plastic substrates have a disadvantage of involving difficulties in forming semiconductor devices thereon because of their poor heat resistance. Quartz substrates are expensive although they withstand high temperatures above 1000° C. and permit a crystalline silicon film to be formed thereon by heating. For this reason, readily available inexpensive glass substrates are commonly used to form thereon thin-film transistors as semiconductor devices.

One known method of producing a crystalline silicon film is a crystallization by heating, as mentioned above. A disadvantage of this method is that the heating temperature is limited by the heat resistance of the glass substrate and hence the complete crystallization cannot be accomplished in a short time at high temperature. Another disadvantage is that the resulting crystalline silicon film is that of microcrystals or polycrystals which contains many internal defects. These disadvantages lead to difficulties in producing integrated circuits which need stable, high-speed operation.

By contrast, a crystallization by laser light irradiation offers a great advantage of being applicable to glass substrates because of freedom from thermal damage to substrates. In addition, it affords a crystalline silicon film with high crystallinity and good electrical properties.

This is true particularly in the case where a pulse laser light (such as excimer laser) is employed. It is believed that the surface of an amorphous silicon film melts instantaneously upon irradiation with a pulse of laser light (which lasts tens of nanoseconds) and solidifies before the subsequent irradiation (which takes tens of nanoseconds). In other words, crystal growth from the liquid state takes place locally and instantaneously in the very short intervals of continual irradiation.

As compared with heating for glass substrates, pulse laser light irradiation affords a higher degree of crystallinity (which leads to better electrical properties), however, the resulting crystalline silicon film still has much more defects than single-crystal silicon. Consequently, laser light irradiation cannot form on a glass substrate integrated circuits comparable to those formed on a well-known single-crystal substrate.

This is because the instantaneous melting and subsequent quenching result in uneven crystal growth and form crystal grain boundaries due to abrupt phase change. Crystal grain boundaries should be minimized because they adversely affect the electrical properties and stability of semiconductor devices.

SUMMARY OF THE INVENTION

An object of the present invention is to provide an apparatus and method for forming a crystalline silicon film on a substrate without causing thermal damage to it by laser light irradiation. According to the present invention, it is possible to produce a crystalline silicon film without problems of uneven crystal growth and crystal grain boundaries.

Another object of the present invention is to provide a method for laser-annealing semiconductor film in general (not limited to silicon film) without abrupt phase change.

According to one aspect of the present invention, an apparatus for laser light irradiation comprises a first means of causing a laser light to impinge on a semiconductor film, a second means of moving the semiconductor film back and forth relative to the laser light such that the laser light scans the surface of the semiconductor film, and a means of selectively heating portions of the semiconductor film which will soon be or has just been irradiated with the laser light.

The above aspect of the present invention is embodied in an apparatus shown in FIG. 1. There are shown a glass substrate 110 and an amorphous semiconductor film 102 formed thereon, to which a linear laser light is irradiated. There is also shown a substrate stage 108 which moves the glass substrate 110 back and forth in the direction of arrow 109. As the substrate stage 108 moves, a laser light 100 impinges on the amorphous silicon film 102 while scanning it continuously. There are shown heaters 105 and 106 which heat portions of the amorphous semiconductor film which will soon be and has just been irradiated with the laser light 100.

According to another aspect of the present invention, an apparatus for laser light irradiation which comprises a first means of causing a line-shaped laser light to impinge on a semiconductor film, a second means of scanning the laser light with respect to the semiconductor film in a direction orthogonal to the elongation direction of the laser light, and a means of heating portions of the semiconductor film which will soon be and has just been irradiated with the laser light.

According to still another aspect of the present invention, an apparatus for laser light irradiation comprises a first means of irradiating a semiconductor film with a laser light and a second means of illuminating with intense light the surrounding of the area irradiated with the laser light.

This aspect of the present invention is embodied by an apparatus shown in FIG. 3. There are shown lamp heating means 300 and 301 which heat the surrounding of the area irradiated with the laser light 100.

According to another aspect of the present invention, an apparatus for laser light irradiation comprises a means of irradiating a line-shaped portion of a semiconductor film with a laser light and a pair of heaters for heating a pair of line-shaped portions of the film, the heaters located apart from each other with a certain gap inbetween. The laser light is directed to the line-shaped portion which is between the pair of line-shaped portions heated by the heaters.

This aspect of the present invention is embodied in an apparatus shown in FIG. 1. There is shown a set of heaters 105 and 106. The laser light 100 is directed onto the semiconductor film through the gap between the heaters.

According to a further aspect of the present invention, an apparatus for laser light irradiation comprises a means to radiate a linear laser light and a means to heat a set of linear areas by illumination with intense light, said set of linear areas to be heated by the heating means being parallel to each other and being partly overlapped, said overlapped part being irradiated with said linear laser light.

This aspect of the present invention is embodied in an apparatus shown in FIG. 3. The apparatus of FIG. 3 has lamp heating means 300 and 301 which are capable of emitting an intense light. By using the lamp heating means 300 and 301, a pair of line shaped regions on a surface is heated. The region where these line shaped regions partly overlap with each other is further irradiated with the line-shaped laser light 100.

According to a still further aspect of the present invention, a method of irradiating a semiconductor film with a laser light comprises selectively heating portions of the semiconductor film which will soon be or has just been irradiated with the laser light during relative scanning of laser light for irradiation.

According to a still further aspect of the present invention, a method of irradiating a semiconductor film with a laser light comprises a step of instantaneously melting a portion of this semiconductor film by irradiating laser light thereto and a step of illuminating with intense light the surrounding of the irradiated portion.

According to the present invention, a silicon semiconductor film is irradiated with a scanning linear laser light in such a way that the portion before and after irradiated with the laser light is heated. This heating protects the laser-irradiated area from abrupt phase change and hence suppresses the formation of crystal grain boundaries induced by abrupt phase change. The consequence is a crystalline silicon film exempt from adverse effects of crystal grain boundaries.

BRIEF DESCRIPTION OF THE DRAWINGS

FIG. 4 is a schematic diagram showing an apparatus for laser light irradiation.

DESCRIPTION OF THE PREFERRED EMBODIMENTS

Embodiment 1

Figure 1:
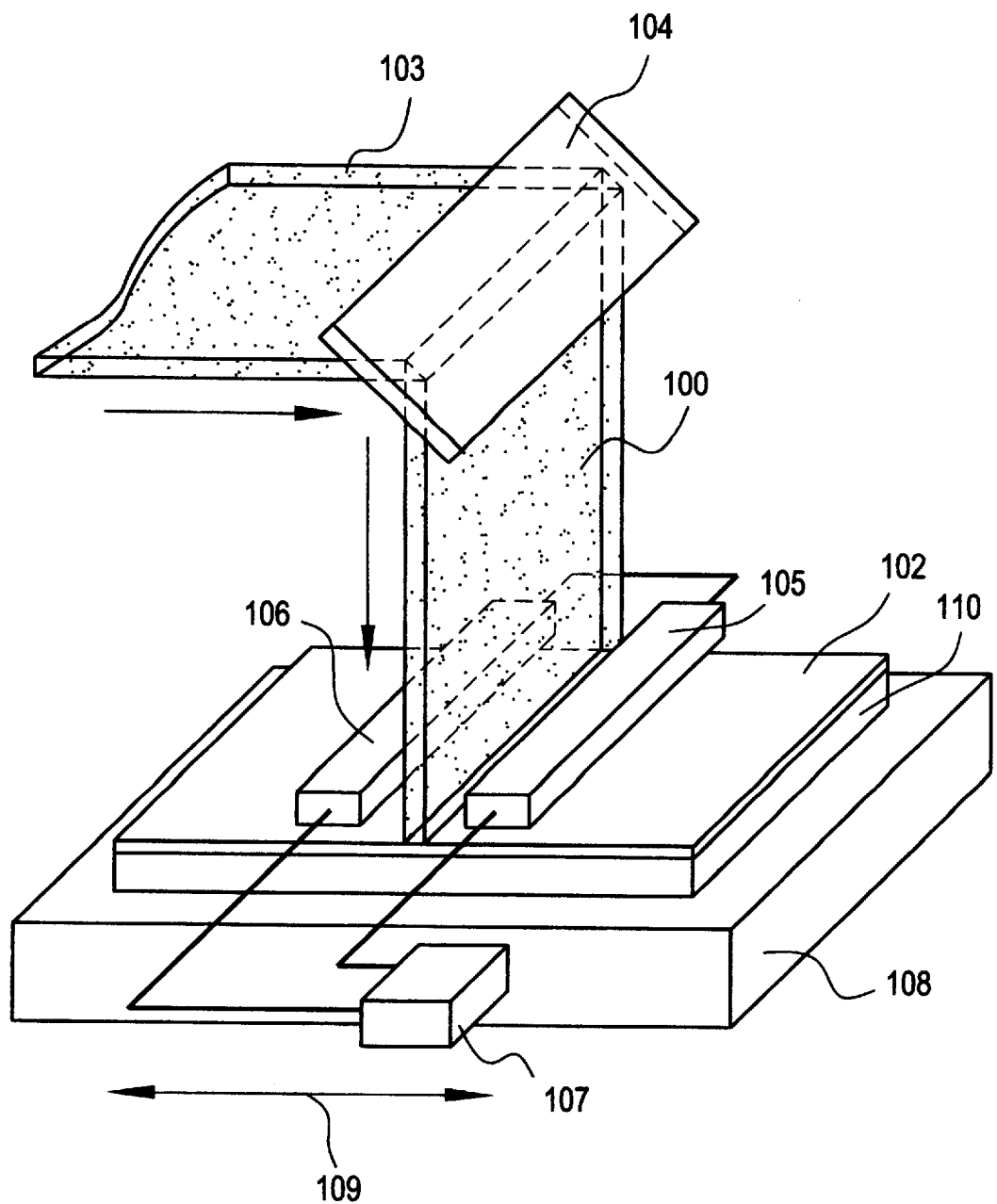
FIG. 1 is a schematic diagram showing an apparatus for laser light irradiation.

FIG. 1 schematically shows an apparatus used in this embodiment. The apparatus is designed to irradiate with a laser light 103 an amorphous silicon film 102 formed on a glass substrate 110.

The laser light 103, which has been formed into a line-shaped beam by an optical system, impinges upon the amorphous silicon film 102 after reflection by a mirror 104. The glass substrate 110 is mounted on a substrate stage 108 which is movable back and forth in the direction of arrow 109. During irradiation with the laser light 100, the substrate stage 108 is moved in one direction so that the entire surface of the amorphous silicon film 102 is irradiated. This method of irradiation contributes to high productivity.

The substrate stage 108 has a heater therein which heats the substrate to a prescribed temperature.

The laser light should preferably be excimer laser capable of pulse generation. Embodiments of the excimer laser that can be used in this embodiment include KrF excimer laser, XeCl excimer laser, and ArF excimer laser.

The area (which is linear or a narrow strip) is heated by the heaters 105 and 106 before and after irradiation with the laser light 100. The heaters 105 and 106 for Joule heating are supplied with electric current from the power source 107. They should be arranged as close to the area of laser light irradiation as possible.

The heaters 105 and 106 are supplied with enough current to heat the amorphous silicon film 102 to a prescribed temperature. This temperature should be as high as possible, however, there is an upper limit determined by the heat resistance of the glass substrate 110. It has been found that the heating temperature should be as high as possible below the strain point of the glass substrate 110.

The heater in the substrate stage 108 heats the substrate 110 to a temperature which is lower by 50° to 100° C. than the temperature of the amorphous silicon film 102 heated by the heaters 105 and 106.

Actual irradiation with a laser light is carried out in the following manner. In this embodiment the glass substrate is Corning 7059 having a strain point of 593° C.

That area of the amorphous silicon film 102 which is under the heaters 105 and 106 is heated to 580° C. by the heaters 105 and 106. Also, the glass substrate 110 is heated to 500° C. by the heater installed in the substrate stage 108.

During laser light irradiation, the substrate stage 108 is moved at a rate of 1 to 10 mm/s, so that the amorphous silicon film 102 is scanned with respect to the linear laser light 100.

Figure 2:
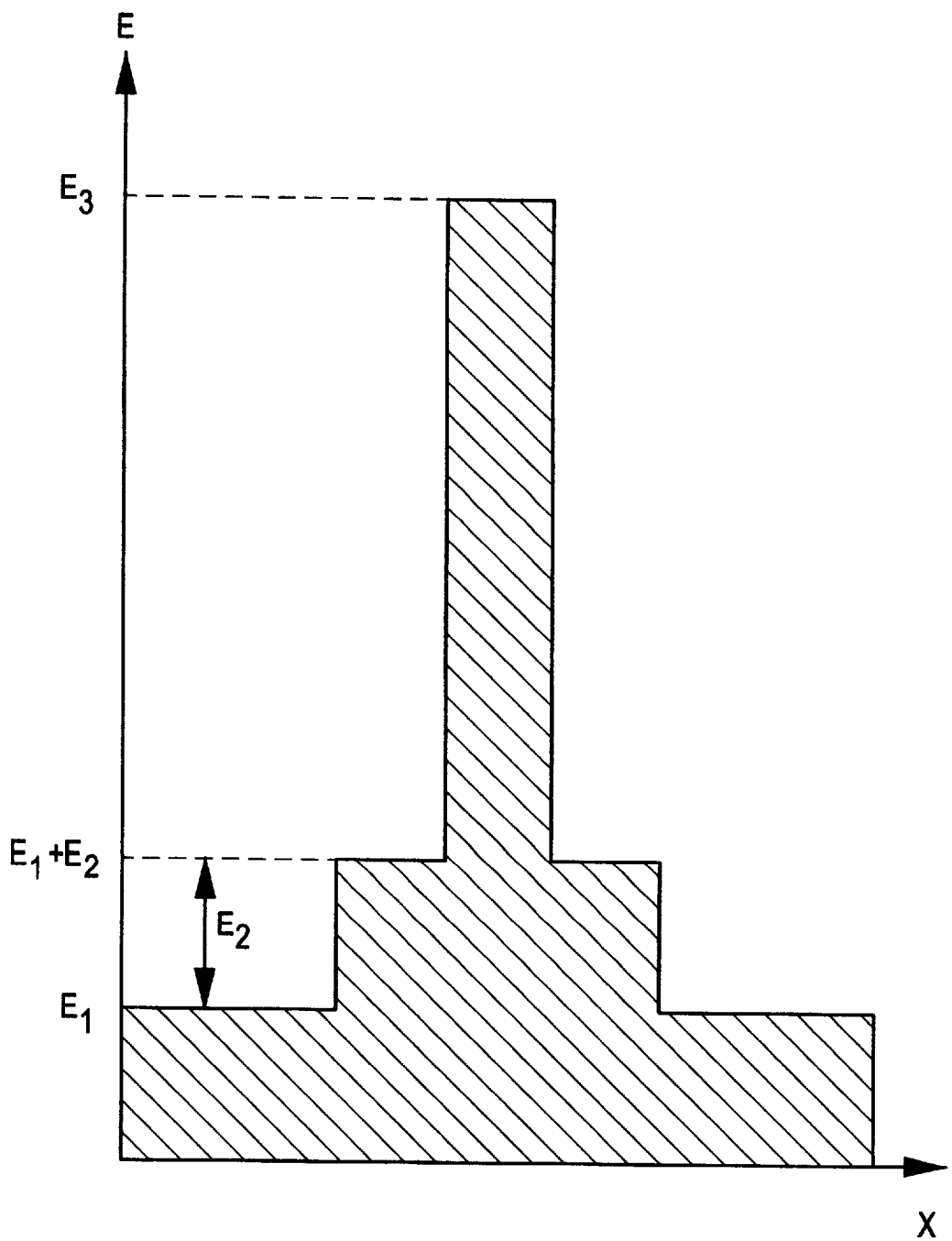
FIG. 2 is a graphical representation showing the energy distribution observed during laser light irradiation.

The irradiation with the linear laser light 100 has an energy distribution as shown in FIG. 2. The vertical axis E represents a relative value of the density of energy applied to the amorphous silicon film 102, and the horizontal axis X represents the moving distance in the direction of arrow 109. $E_1$ denotes the density of energy applied to the amorphous silicon film 102 (heated at 500° C.) by the heater installed in the substrate stage 108. $E_2$ denotes the density of energy applied to the amorphous silicon film 102 by the heaters 105 and 106. $E_3$ denotes the density of energy supplied by the laser light 100. The energy density is expressed in terms of mJ/cm² on the surface of the amorphous silicon film 102. $E_3$ includes the sum of $E_1$ and $E_2$, however, only $E_3$ is given here because $E_3$ is much greater than $E_1$ and $E_2$.

Upon irradiation with the laser light 100, the amorphous silicon film 102 within the irradiated area melts instantaneously. However, the molten part does not solidify immediately after termination of laser light irradiation which lasts for tens of nanoseconds, because it is surrounded by areas which are given energies $E_1$ and $E_2$. In addition, irradiation with the linear laser light 100 proceeds simultaneously with slow scanning. Therefore, no abrupt phase change occurs and crystal growth proceeds slowly. Thus it is possible to produce a crystalline silicon film containing very few crystal grain boundaries. If proper conditions are selected, it is possible to produce an area which is regarded entirely or partly as a single crystal.

Embodiment 2

This embodiment demonstrates laser annealing of an amorphous silicon film formed on a glass substrate, by using the same apparatus as used in Embodiment 1.

The glass substrate is Corning 1737 measuring 10×10 cm and having a strain point of 667° C., an annealing point of 721° C., and a softening point of 975° C. It can be heated up to about 650° C. Despite its large area, it can be kept heated at about 600° C. for a long period of time (several hours).

On the glass substrate is formed a silicon oxide film, 3000 Å thick (as an underlying film), by sputtering or plasma CVD. This silicon oxide film functions as a barrier film which prevents the scattering of impurities from the glass substrate in subsequent steps. On this silicon oxide film is formed an amorphous silicon film, 500 Å thick, by plasma CVD or reduced-pressure heat CVD.

Irradiation with a laser light is carried out by using the apparatus shown in FIG. 1, in which there are shown a glass substrate 110 (Corning 1737) and the 500 Å-thick amorphous silicon film 102 which is formed on the silicon oxide film (not shown).

During laser light irradiation, the amorphous silicon film 102 is locally heated at 650° C. by the heaters 105 and 106. (The heated part is under the heaters.) The glass substrate is also heated at 600° C. by the heater installed in the substrate stage 108.

The substrate stage 108 is moved at a rate of 1 to 10 mm/s, so that the amorphous silicon film 102 is scanned with the linear laser light 100.

Embodiment 3

This embodiment demonstrates heat annealing of an amorphous silicon film formed on a glass substrate, by using infrared lamps in place of the heaters used in Embodiment 1. The laser light apparatus is schematically shown in FIG. 3.

A laser light generated by a laser unit (not shown) is shaped into a line-shaped laser light 103 by an optical system (not shown) so that the cross section of the beam orthogonal to the propagation direction thereof has an elongated shape. After reflection by a mirror 104, the line-shaped laser light 103 impinges on the amorphous silicon film 102 formed on the glass substrate 110. The substrate 110 is placed on a substrate stage 108 which moves back and forth in the direction of arrow 109. While the substrate stage 108 is moved straight in one direction, the entire surface of the amorphous silicon film 102 is irradiated with the laser light 100.

That area of the surface of the amorphous silicon film 102 which is to be and has been irradiated with the laser light 100 is illuminated with infrared rays emitted from the halogen lamps 300, 301. Since infrared rays are readily absorbed by the silicon film but hardly absorbed by the glass substrate 110, it is possible to selectively heat the amorphous silicon film 102 with infrared rays. This lamp heating can raise the surface temperature of the amorphous silicon film 102 on the glass substrate 110 to about 1000° C. Adequate heating conditions should be experimentally established because peel off or crack due to thermal expansion of the glass substrate 110 occurs. In general, heating by the lamps 300 and 301 should be carried out such that the surface temperature of the amorphous silicon film 102 is 700° to 900° C.

Figure 3:
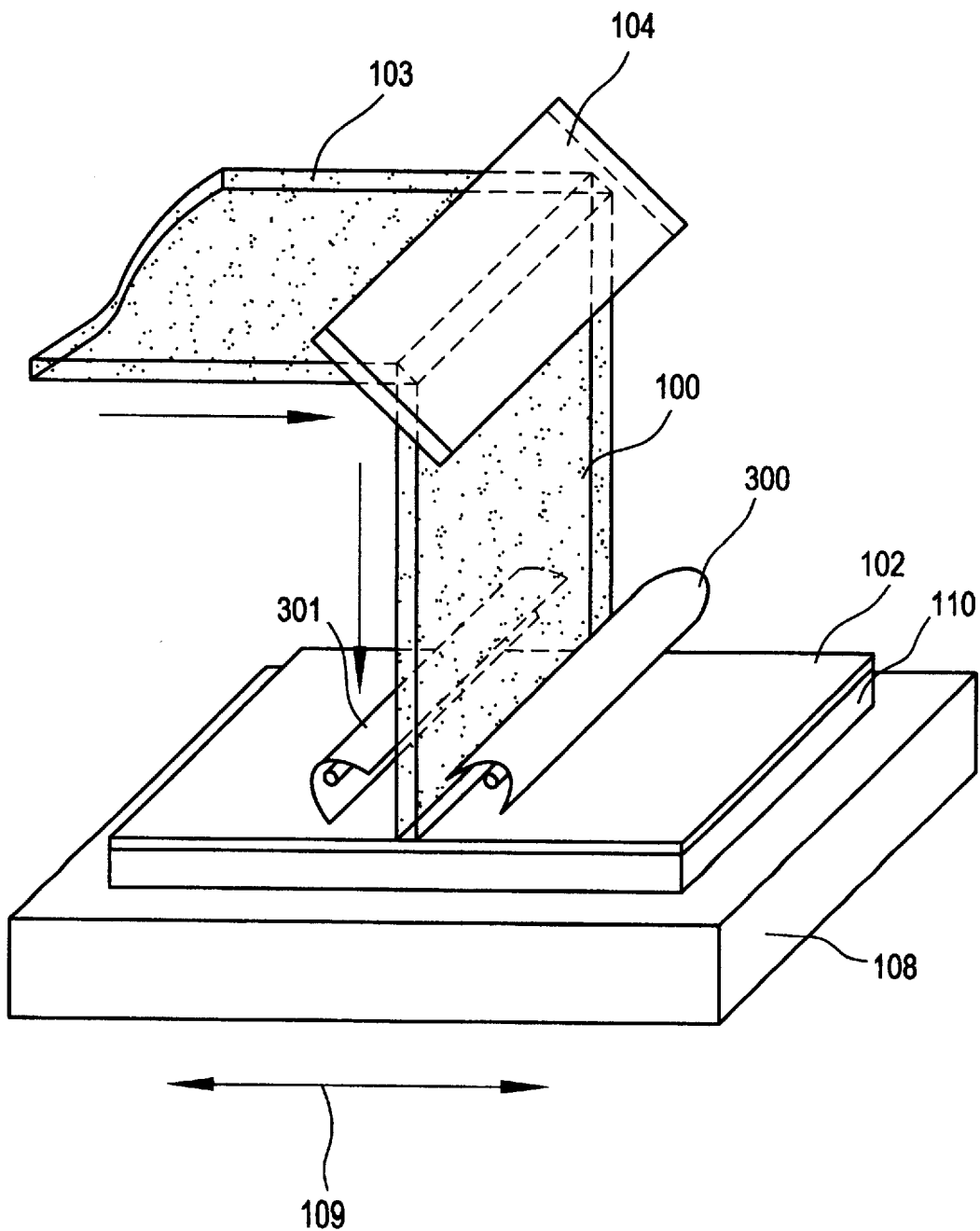
FIG. 3 is a schematic diagram showing an apparatus for laser light irradiation.

Energy supply to the amorphous silicon film 102 by operation shown in FIG. 3 is similar to that shown in FIG. 2. Therefore, the crystallization by laser light 100 irradiation does not involve abrupt phase change but forms a crystalline silicon film containing very few crystal grain boundaries. Irradiation under proper conditions converts the amorphous silicon film entirely or partly into a silicon film to be regarded as a single crystal.

The laser irradiation conditions for achieving the single crystal like state should be selected severely. The optimum condition may not be obtained due to an only slight variation in the laser power. For example, the variation in the excimer laser power at the level of some percents will significantly influences the condition of the crystallization. Accordingly, it is necessary to optimize the laser irradiation conditions through a number of experiments.

The area that is regarded as a single crystal contains carbon and nitrogen atoms ($1\times10^{16}$ to $5\times10^{18}$ cm$^{-3}$), oxygen atoms ($1\times10^{17}$ to $5\times10^{19}$ cm$^{-3}$), and hydrogen atoms neutralizing silicon dangling bonds ($1\times10^{17}$ to $5\times10^{20}$ cm$^{-3}$). Thus it differs from an ordinary single-crystal wafer. It is characterized by hydrogen atoms which neutralize dangling bonds.

In this embodiment, it is not always necessary to produce the single-crystal state. The resulting crystalline silicon film still has good quality, with a minimal effect of crystal grain boundaries. Such a silicon film is affected little by the low trap level due to crystal grain boundaries, which contributes to the characteristics and stability of semiconductor devices.

Embodiment 4

Figure 5A:
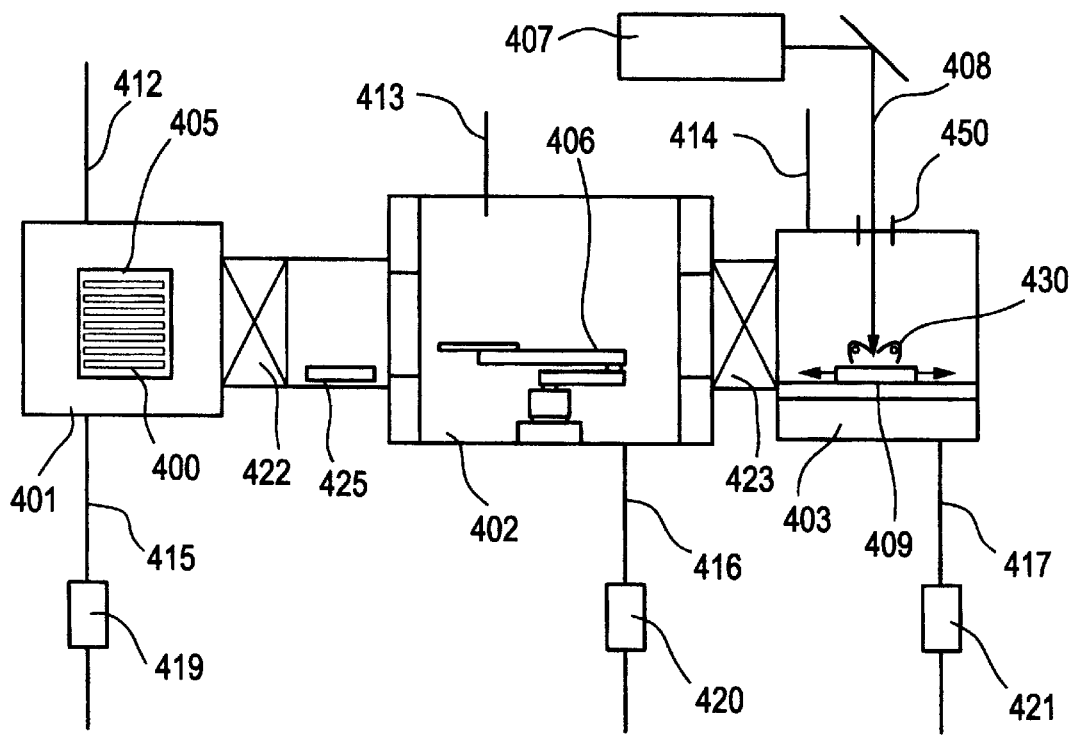
FIGS. 5(a) and 5(b) are schematic diagrams showing an apparatus for laser light irradiation.
Figure 5B:
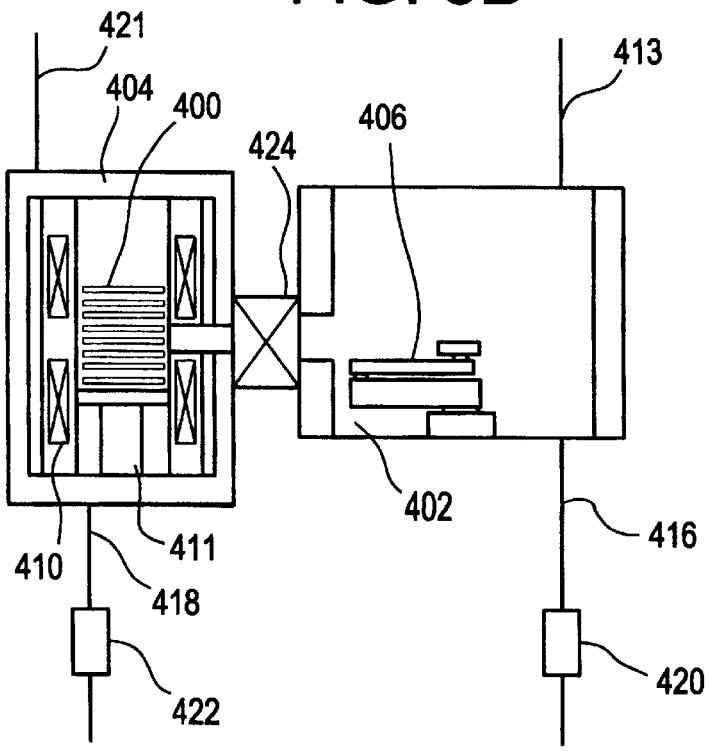

This embodiment demonstrates laser light irradiation by a multi-chamber shown in FIGS. 4 and 5(a), 5(b). This apparatus is capable of processing a number of substrates one by one sequentially. FIG. 5(a) is a sectional view taken along the line A A' in FIG. 4. FIG. 5(b) is a sectional view taken along the line B–B' in FIG. 4.

In FIGS. 5(a) and 5(b), there is shown a cartridge 405 to hold a number of substrates 400 to be irradiated with a laser light. (Each substrate has a silicon film formed thereon.) This cartridge 405 is brought into the load/unload chamber 401. After all the substrates 400 have undergone laser annealing, the cartridge 405 is removed from the load/unload chamber 401. The load/unload chamber 401 is provided with a feeding pipe 412 for nitrogen or inert gas and an evacuating system 415 leading to a vacuum pump 419.

The load/unload chamber 401 communicates with the substrate transfer chamber 402 through the gate valve 422. The substrate transfer chamber 402 is provided with the robot arm 406 which transfers the substrates 400 one by one. The relative position of the substrate 400 and the robot arm 406 is accurately established by the alignment mechanism 425.

The substrate transfer chamber 402 is provided with a feeding pipe 413 for nitrogen or inert gas and an evacuating system 416 leading to a vacuum pump 420. The substrate transfer chamber 402 communicates with the heating chamber 404 through the gate valve 424. The heating chamber 404 is intended to preheat the substrates 400 to a prescribed temperature prior to irradiation with a laser light. The heating chamber 404 is so constructed as to hold a number of substrates 400 which are heated by the heating means 410 (with resistance heating). The stacked substrates 400 are raised by the elevator 411 when they are transferred by the robot arm 406. The heating chamber 404 is provided with a feeding pipe 421 for nitrogen or inert gas and an evacuating system 418 provided with a vacuum pump 422.

Laser light irradiation is carried out in the laser light irradiation chamber 403, which communicates with the substrate transfer chamber 402 through the gate valve 423. The laser light irradiation chamber 403 is provided with a stage 409 which moves back and forth in the direction of arrow. On the stage 409 is mounted the substrate 400 to be irradiated with a laser light. The laser light is emitted from the laser unit 407 and reflected by the mirror and impinges on the substrate 400 (not shown) mounted on the stage 409.

(The optical system to form the linear beam is not shown in the diagram.) The substrate 400 mounted on the stage 409 is irradiated with infrared rays emitted from the lamp 430. Their arrangement is shown in detail in FIG. 3.

The apparatus shown in FIGS. 4 and 5(a) and 5(b) is operated in the following manner to perform laser annealing on an amorphous silicon film formed on a glass substrate. All the chambers are filled with nitrogen instead of being evacuated. Prior to the operation, the substrate transfer chamber 402, the laser light irradiation chamber 403, and the heating chamber 404 are filled with nitrogen, with all the gate valves 422 to 424 closed.

The first step of operation is to bring the cartridge 405 holding a number of substrates 400 into the load/unload chamber 401 through a door (not shown). With the door closed, the load/unload chamber 401 is filled with nitrogen (at atmospheric pressure) introduced through the gas feeding pipe 412.

The gate valves 422 and 424 are opened. (The former may be left open until a series of steps is completed.) One substrate 400 is picked up from the cartridge 405 by the robot arm 406. The alignment mechanism 425 adjusts the position of the substrate 400 relative to the robot arm 406. A predetermined number of substrates 400 are brought into the heating chamber 404.

With the gate valve 424 closed, the substrates 400 are heated to a prescribed temperature. With the gate valve 424 opened, one substrate 400 is transferred by the robot arm 406 from the heating chamber 404 to the substrate transfer chamber 402. The alignment mechanism 425 works again for right positioning. The alignment mechanism 425 should be heat-resistant up to about 600° C.

With the gate valve 423 opened, the substrate 400 is brought into the laser light irradiation chamber 403, in which it is placed on the stage 409. The gate valves 424 and 423 are then closed. It is desirable that the gate valve 424 be opened and closed each time the substrate 400 is brought in and out so that the robot arm 406 and other mechanical parts are not affected by heat from the heating chamber 404.

With the gate valve 423 closed, the substrate 400 in the laser light irradiation chamber 403 is irradiated with a laser light. During laser light irradiation, the substrate 400 is kept at the same temperature as the heating chamber 404 by the heater installed in the stage 409. After laser light irradiation, the gate valve 423 is opened and the substrate 400 is returned to the cartridge 405 by the robot arm 406. In this way treatment of one substrate 400 is completed.

The gate valve 424 is opened and the next substrate 400 is removed from the heating chamber 404 and transferred into the laser light irradiation chamber 403. By repeating the above-mentioned steps, the substrates 400 held in the heating chamber 404 undergo laser annealing one by one continuously.

It is necessary that the temperature in the heating chamber 404 be lower than that at which the amorphous silicon film crystallizes, because the individual substrates 400 vary in residence time in the heating chamber 404. In general, the temperature in the heating chamber 404 should be about 200° to 400° C., which is equal to the temperature of the substrate 400 being irradiated with a laser light.

Embodiment 5

This embodiment is directed to a laser crystallization in which a metal element is used to promote the crystallization of silicon. Examples of the metallic element include Fe, Co, Ni, Ru, Rh, Pd, Os, Ir, Pt, Cu, and Au. They may be used alone or in combination with one another. Of these elements, Ni has been found by experiment to be most effective.

The first step is to form a silicon oxide film (3000 Å thick) on a glass substrate (Corning 7059 or 1737) by sputtering or plasma CVD. Then, an amorphous silicon film (500 Å thick) is formed by reduced-pressure thermal CVD or plasma CVD. The amorphous silicon film is coated by spinning with a solution of nickel acetate. The amount of nickel to be introduced may be controlled by adjusting the concentration of the nickel acetate solution.

The amorphous silicon film coated with nickel acetate is irradiated with a laser light for conversion into a crystalline silicon film.

The concentration of said metallic element in the silicon film should be $1 \times 10^{18}$ to $5 \times 10^{18}$ cm$^{-3}$. The concentration above the lower limit is required to promote a crystallization, and the concentration above the upper limit results in undesirable metal silicide.

The crystallization of semiconductor thin film by irradiation with a laser light is improved by heating the area which will soon be or has just been irradiated with a scanning laser light. This heating prevents the abrupt phase change (and hence the occurrence of crystal grain boundaries) in the semiconductor thin film which would otherwise be induced by irradiation with a laser light. Therefore, according to the present invention, it is possible to obtain a crystalline silicon film having good crystallinity as well as good electrical properties.

What is claimed is:

1. A method of manufacturing a semiconductor device comprising the steps of:

preparing a semiconductor film over a substrate;

directing a pulsed laser beam toward said semiconductor film to heat a first portion of the semiconductor film wherein said pulsed laser beam has an elongated cross section at said semiconductor film extending in one direction and said first portion corresponds to said elongated cross section;

selectively heating a second portion of the semiconductor film by using a different heat source from said pulsed laser beam simultaneously as the heating of said first portion wherein said second portion extends in parallel to said first portion and is adjacent to said first portion;

moving said substrate relative to said pulsed laser beam and said different heat source in a direction orthogonal to said one direction.

2. A method according to claim 1 wherein an energy density which said first portion receives from said pulsed laser beam is larger than an energy density which said second portion receives from said different heat source.

3. A method according to claim 1 wherein said pulsed laser beam is an excimer laser beam.

4. A method according to claim 1 wherein said substrate is moved at 1 mm/s to 10 mm/s.

5. A method according to claim 1 wherein said semiconductor film comprises amorphous silicon.

6. A method according to claim 1 wherein said different heat source comprises IR lamp.

7. A method according to claim 1 wherein said semiconductor film is crystallized by irradiation of said pulsed laser beam and said semiconductor film after the irradiation contains carbon at a concentration of $1 \times 10^{17}$ to $5 \times 10^{19}$ cm$^{-3}$, oxygen at $1 \times 10^{17}$–$5 \times 10^{19}$ cm$^{-3}$, and hydrogen which is for neutralizing a recombination center of silicon at $1 \times 10^{17}$–$5 \times 10^{20}$ cm$^{-3}$.

8. A method according to claim 1 wherein said substrate is moved at 1 mm/s to 10 mm/s.

9. A method of manufacturing a semiconductor device comprising the steps of:

preparing a semiconductor film over a substrate;

directing a pulsed laser beam toward said semiconductor film to heat a first portion of the semiconductor film wherein said pulsed laser beam has an elongated cross section at said semiconductor film extending in one direction and said first portion corresponds to said elongated cross section;

selectively heating a pair of second portions of the semiconductor film by using a different heat source from said pulsed laser beam simultaneously as the heating of said first portion wherein said pair of second portions extend in parallel to said first portion and said first portion is located between said pair of second portions;

moving said substrate relative to said pulsed laser beam and said different heat source in a direction orthogonal to said one direction.

10. A method according to claim 9 wherein an energy density which said first portion receives from said pulsed laser beam is larger than an energy density which said second portions receive from said different heat source.

11. A method according to claim 9 wherein said pulsed laser beam is an excimer laser beam.

12. A method according to claim 9 wherein said substrate is moved at 1 mm/s to 10 mm/s.

13. A method according to claim 9 wherein said semiconductor film comprises amorphous silicon.

14. A method according to claim 9 wherein said different heat source comprises IR lamp.

15. A method according to claim 9 wherein said semiconductor film is crystallized by irradiation of said pulsed laser beam and said semiconductor film after the irradiation contains carbon at a concentration of $1\times10^{17}$ to $5\times10^{19}$ $cm^{-3}$, oxygen at $1\times10^{17}$–$5\times10^{19}$ $cm^{-3}$, and hydrogen which is for neutralizing a recombination center of silicon at $1\times10^{17}$–$5\times10^{20}$ $cm^{-3}$.

16. A method of manufacturing a semiconductor device comprising the steps of:

preparing a semiconductor film comprising amorphous silicon over a substrate;

directing a pulsed laser beam toward said semiconductor film to heat a first portion of the semiconductor film at a first temperature at which said semiconductor film melts wherein said pulsed laser beam has an elongated cross section at said semiconductor film extending in one direction and said first portion corresponds to said elongated cross section;

selectively heating a second portion of the semiconductor film at a second temperature lower than said first temperature by using a different heat source from said pulsed laser beam simultaneously as the heating of said first portion wherein said second portion extends in parallel to said first portion and is adjacent to said first portion;

moving said substrate relative to said pulsed laser beam and said different heat source in a direction orthogonal to said one direction.

17. A method according to claim 16 wherein said second temperature is within a range from 700° to 900° C.

18. A method according to claim 16 wherein an energy density which said first portion receives from said pulsed laser beam is larger than an energy density which said second portion receives from said different heat source.

19. A method according to claim 16 wherein said pulsed laser beam is an excimer laser beam.

20. A method according to claim 16 wherein said different heat source comprises a lamp.

21. A method according to claim 16 wherein said semiconductor film is crystallized by irradiation of said pulsed laser beam and said semiconductor film after the irradiation contains carbon at a concentration of $1\times10^{17}$ to $5\times10^{19}$ $cm^{-3}$, oxygen at $1\times10^{17}$–$5\times10^{19}$ $cm^{-3}$, and hydrogen which is for neutralizing a recombination center of silicon at $1\times10^{17}$–$5\times10^{20}$ $cm^{-3}$.

* * * * *